United States Patent
Kotani et al.

(10) Patent No.: US 7,499,582 B2
(45) Date of Patent: Mar. 3, 2009

(54) METHOD FOR INSPECTING A DEFECT IN A PHOTOMASK, METHOD FOR MANUFACTURING A SEMICONDUCTOR DEVICE AND METHOD FOR PRODUCING A PHOTOMASK

(75) Inventors: Toshiya Kotani, Machida (JP); Suigen Kyoh, Yokohama (JP); Shinji Yamaguchi, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 961 days.

(21) Appl. No.: 10/878,384

(22) Filed: Jun. 29, 2004

(65) Prior Publication Data

US 2005/0025351 A1 Feb. 3, 2005

(30) Foreign Application Priority Data

Jun. 30, 2003 (JP) ............................. 2003-188487

(51) Int. Cl.
*G06K 9/00* (2006.01)
(52) U.S. Cl. ...................................... 382/144; 382/149
(58) Field of Classification Search ................. 382/144, 382/149
See application file for complete search history.

(56) References Cited

U.S. PATENT DOCUMENTS 6,483,937 B1 * 11/2002 Samuels ...................... 382/144
6,865,288 B1 * 3/2005 Shishido et al. ............. 382/145

FOREIGN PATENT DOCUMENTS

| JP | 6-242594 | 9/1994 |
|---|---|---|
| JP | 8-272079 | 10/1996 |
| JP | 11-7120 | 1/1999 |
| JP | 2000-106336 | 4/2000 |
| JP | 2001-272770 A | 10/2001 |
| JP | 2002-162729 | 6/2002 |
| JP | 2002-258463 | 9/2002 |
| JP | 2003-162043 A | 6/2003 |

OTHER PUBLICATIONS

Notification of Reasons for Rejection from the Japanese Patent Office, mailed May 23, 2006, in Japanese Patent Application No. 2003-188487, and English Translation thereof.

(Continued)

*Primary Examiner*—Matthew C Bella
*Assistant Examiner*—John B Strege
(74) *Attorney, Agent, or Firm*—Finnegan, Henderson, Farabow, Garrett & Dunner, L.L.P.

(57) ABSTRACT

There is disclosed a method for inspecting a defect in a photomask which is produced by using a graphic data, that matches mask data or is produced by subjecting mask data to correction of a process conversion difference relating to at least a line width. The method includes the following steps. Inspection data is produced by correcting a pattern of mask data so as to substantially match a planar shape of a pattern of a photomask to be produced by using the graphic data. A pattern of a produced photomask is compared with a pattern of the inspection data. Portions where planar shapes of the pattern of the inspection data and the pattern of the produced photomask do not match are extracted. A defect is distinguished from the portions where the planer shapes do not match.

15 Claims, 8 Drawing Sheets

OTHER PUBLICATIONS

Decision of Rejection issued by the Japanese Patent Office on May 15, 2007, for Japanese Patent Application No. 2003-188487, and English-language translation thereof.

Notification of Reasons for Rejection from the Japanese Patent Office, mailed Oct. 10, 2006, in Japanese Patent Application No. 2003-188487, and English Translation thereof.

* cited by examiner

METHOD FOR INSPECTING A DEFECT IN A PHOTOMASK, METHOD FOR MANUFACTURING A SEMICONDUCTOR DEVICE AND METHOD FOR PRODUCING A PHOTOMASK

CROSS-REFERENCE TO RELATED APPLICATIONS

This application is based upon and claims the benefit of priority from prior Japanese Patent Application No. 2003-188487, filed Jun. 30, 2003, the entire contents of which are incorporated herein by reference.

BACKGROUND OF THE INVENTION

1. Field of the Invention

The present invention relates to a method for inspecting a defect in a photomask for manufacturing a semiconductor device, a method for manufacturing a semiconductor device and a method for producing a photomask.

2. Description of the Related Art

An EB graphic drawing apparatus using an electron beam and a photo-repeater using a laser beam are known as apparatuses for drawing a pattern on a photomask. The photo-repeater is an apparatus in which an exposure apparatus for use in forming a pattern on a wafer is used to transfer a pattern on a photomask. The photo-repeater makes it possible to obtain a photomask having high dimension-uniformity.

Since the photo-repeater uses a laser beam such as an I beam, a KrF beam or an ArF beam, a photo-proximity effect arises when a pattern is drawn. Due to the photo-proximity effect, a line width, a corner shape and a line portion end shape of a pattern of a photomask cannot conform to those of the pattern of design data. However, as regards the line width of a pattern, the photomask can almost conform to the design data by means of known simulation using optical parameters and correction to the design data (photo-proximity effect correction).

Figure 17:
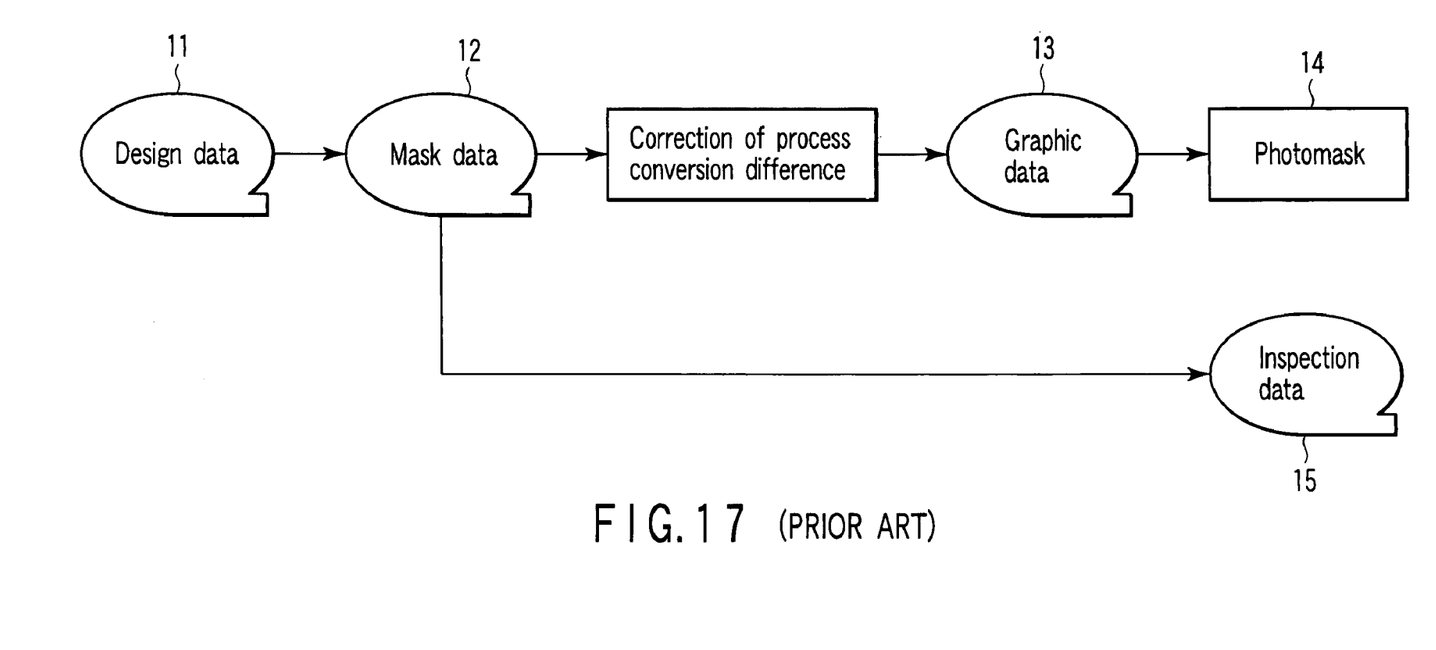
FIG. 17 is a diagram illustrating steps of producing a photomask and inspection data from design data according to the prior art.

A method of comparing a produced photomask with the design data for producing the photomask is known as a method for inspecting a photomask. FIG. 17 shows a conventional inspection method. As shown in FIG. 17, mask data 12 based on design data 11 is subjected to correction in accordance with a process conversion difference, so that graphic data 13 is produced. The process conversion difference means a correction value determined depending on a difference in shape between the mask data 12 and the produced photomask, which occurs in the process of producing the mask. When the process conversion difference is determined, the photo-proximity effect and the difference that occurs in etching or the like are taken into consideration.

Then, a photomask 14 is produced in accordance with the graphic data 13 by means of an EB graphic drawing apparatus, a photo-repeater or the like. The photomask 14 is compared with inspection data 15, so that whether the photomask 14 is defective or not is determined. The inspection data 15 is the same in shape as the mask data 12.

BRIEF SUMMARY OF THE INVENTION

According to a first aspect of the present invention, there is provided a method for inspecting a defect in a photomask which is produced by using graphic data, that match mask data or are produced by subjecting mask data to correction of a process conversion difference relating to at least a line portion width, the method comprising: producing inspection data by correcting a pattern of mask data so as to substantially match a planar shape of a pattern of a photomask to be produced by using the graphic data; comparing a pattern of a produced photomask with a pattern of the inspection data; extracting portions where planar shapes of the pattern of the inspection data and the pattern of the produced photomask do not match; and distinguishing a defect from the portions where the planer shapes do not match.

According to a second aspect of the present invention, there is provided a method for manufacturing a photomask by using graphic data, that match mask data or are produced by subjecting mask data to correction of a process conversion difference relating to at least a line portion width, the method comprising: producing inspection data by correcting a pattern of mask data so as to substantially match a planar shape of a pattern of a photomask to be produced by using the graphic data; comparing a pattern of a produced photomask with a pattern of the inspection data; extracting portions where planar shapes of the pattern of the inspection data and the pattern of the produced photomask do not match; distinguishing a defect from the portions where the planer shapes do not match; and selecting the photomask which is determined as having no defect.

DETAILED DESCRIPTION OF THE INVENTION

The process conversion difference relating to a line width can be uniformly obtained by simulation. Correction based on the process conversion difference relating to a line width can be easily performed by, for example, increasing the line width. However, as regards a pattern at a corner and line portion end, it is difficult to obtain the process conversion difference and perform correction based on it. Therefore, the photomask 14 produced by the method shown in FIG. 17 differs in a pattern shape from the mask data 12 at the corner and line portion end.

The inspection data 15 is the same as the mask data 12 in shape. Therefore, there is a difference between the photomask 14 and the inspection data 15 in the pattern at the corner and line portion end. As a result, it is determined that the photomask 14 has a defect (hereinafter referred to as a pseudo-defect) in these portions. Since the pseudo-defect may occur in the pattern at every corner and every line portion end, the number of pseudo-defects may be great. Therefore, it takes a lot of time to determine whether the photomask 14 having pseudo-defects has a real defect and to distinguish a pseudo-defect from a real defect. This increases the time for inspecting a defect in the photomask.

In particular, if a photo-repeater is used, the fidelity of shapes in pattern of the photomask 14 at corners and line portion ends may lower considerably, resulting in a great difference between the photomask 14 and the inspection data 15. Hence, it is highly possible that the produced photomask 14 may be determined defective. Therefore, the above problem may be more serious in this case.

Embodiments of the present invention will be described below with reference to the accompanying drawings. In the following description, the elements having substantially the same function and structure are identified by the same reference symbol. Description of such elements will be repeated only when necessary.

First Embodiment

Figure 1:
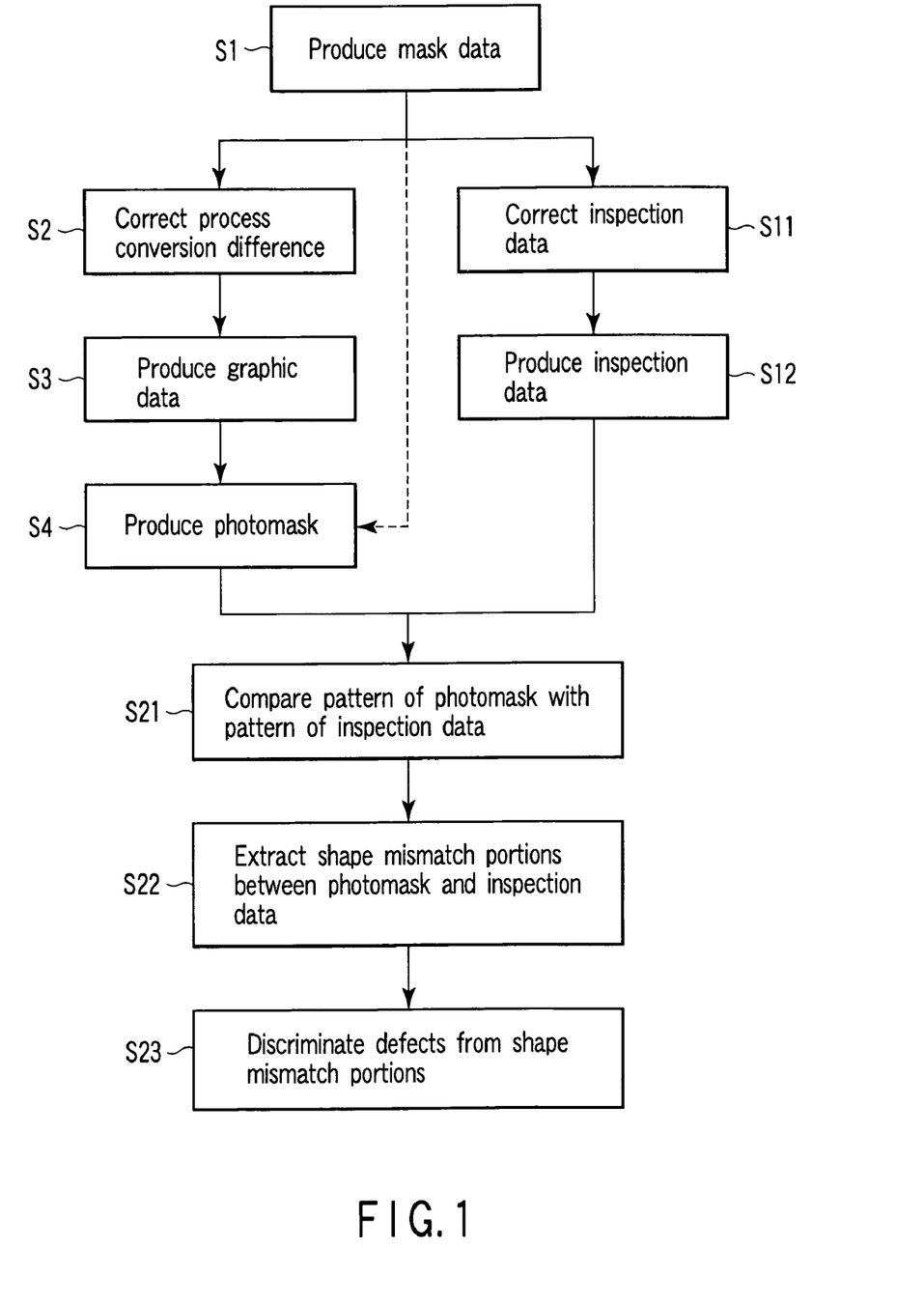
FIG. 1 is a flowchart illustrating a method for inspecting a defect of a photomask according to a first embodiment of the present invention.
Figure 2:
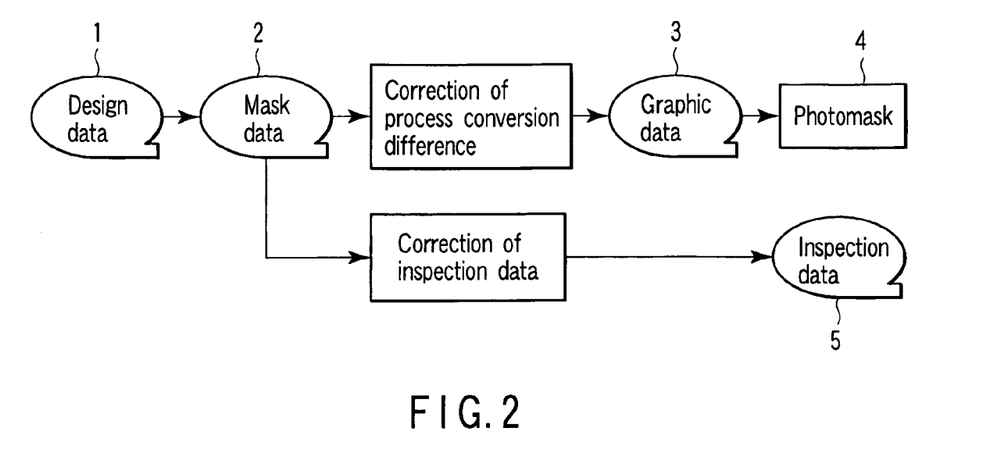
FIG. 2 is a diagram illustrating steps of producing a photomask and inspection data from design data.

FIG. 1 is a flowchart illustrating a method for inspecting a defect of a photomask according to a first embodiment of the present invention. FIG. 2 schematically shows steps of producing a photomask and inspection data. As shown in FIGS. 1 and 2, first, mask data 2 is produced on the basis of design data 1 having a desired pattern (for example, a gate pattern of a transistor) (a step S1).

Then, the mask data 2 is subjected to correction of a process conversion difference (a step S2). The correction of the process conversion difference includes correction of a conversion difference, which arises in a wafer process (lithography, etching, etc. of a photomask), including the correction of photo-proximity effect. As a result of the correction of the process conversion difference of the mask data 2, graphic data 3 is produced (a step S3). The correction of the process conversion difference chiefly includes correction that can be dealt with by increasing the line width of a pattern.

In the step of producing the mask data 2 from the design data 1, a conversion difference that arises in the wafer process may be corrected. In this case, the steps S2 and S3 will be omitted, and a photomask can be produced by using mask data in a next step S4. This route is indicated by the broken line in FIG. 1.

Then, a photomask 4 is produced by an exposure apparatus (graphic apparatus), such as a photo-repeater (the step S4) in accordance with the graphic data 3. More specifically, the exposure apparatus transfers a pattern to a material of the photomask 4 by using the graphic data 3. The transferred pattern is developed, thereby forming the photomask 4. In the case of using the photo-repeater, an excimer laser beam, such as a KrF, ArF or $F_2$ laser beam, is used in the exposure apparatus. A series of steps for producing the photomask 4 from the mask data 2 is hereinafter referred to as the main flow.

Separately from the main flow, inspection data 5 is produced from the mask data 2. The inspection data 5 is produced by subjecting the mask data 2 to inspection data correction (a step S11). In the inspection data correction, a corner and an end of a pattern is chiefly subjected to the correction. The inspection data correction will be described later in detail. As a result of the inspection data correction, inspection data 5 is produced (a step S12).

Thereafter, the pattern of the photomask 4 is compared with the pattern of the inspection data 5 (a step S21). As a result, portions of the photomask 4 and the inspection data, shapes of which do not match, are extracted (a step S22).

Then, of the portions in which the shapes of the patterns do not match (shape mismatch portions), a defect of the photomask 4 is distinguished (a step S23). The distinction is achieved by, for example, determining a shape mismatch portion as a defect when the difference between the patterns of the photomask 4 and the inspection data reaches a predetermined value or more.

If no shape mismatch portions are detected in the step S22, or if a detected shape mismatch portion is determined to be a pseudo-defect, the produced photomask (production photomask) 4 is determined to be a conforming item (with no defect).

A method for correcting inspection data will now be described. In the example described below, a design rule check (DRC) tool for use in checking a design layout is used in correction of inspection data. The DRC tool makes it possible to extract and deform a pattern corresponding to the characteristic of a layout, to check whether the layout has been produced in conformity with a predetermined design rule, and to correct a predetermined pattern.

First, correction of a pattern corner will be described with reference to FIGS. 3 to 7. FIGS. 3 to 7 schematically show a pattern P having a corner. FIG. 7 is a flowchart illustrating a process for correction at the corner of the pattern P.

Figure 3:
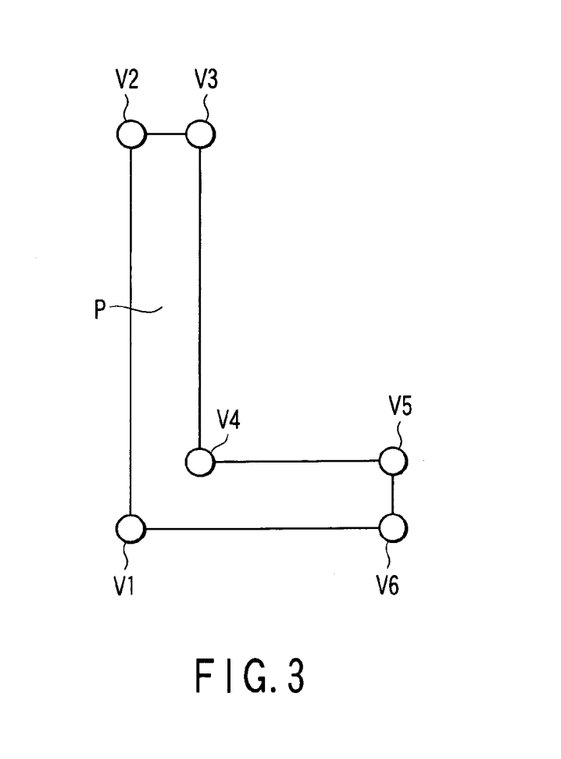
FIG. 3 is a diagram illustrating a step of a method for correcting a pattern at a corner.

As shown in FIGS. 3 and 7, first, the positions of vertices V1 to V6 of the pattern P are extracted (a step S31). In this time, it is possible to extract only a pattern P having a width W smaller than a predetermined value, and extract the vertices of the extracted pattern P.

Figure 4:
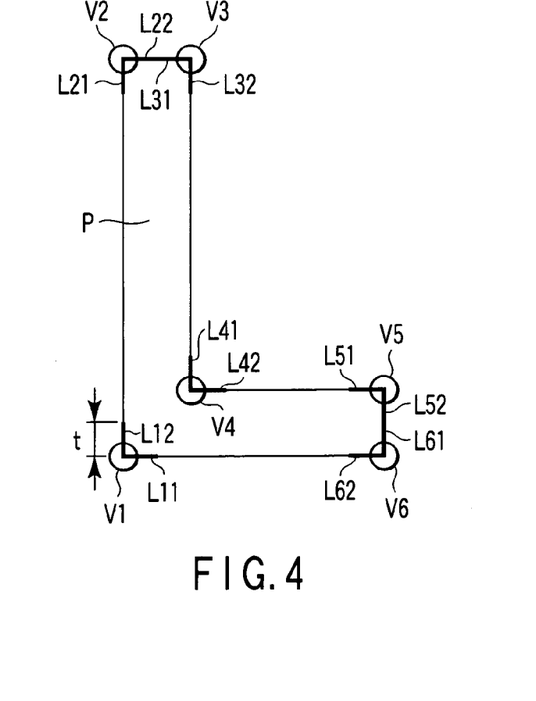
FIG. 4 is a diagram illustrating a step subsequent to that shown in FIG. 3.

Then, as shown in FIGS. 4 and 7, line segments on two sides extending from each of the vertices V1 to V6 with a distance t from the vertex are extracted (a step S32). Line segments L11 and L12 extend from the vertex V1. Likewise, line segments L21 and L22 extend from the vertex V2, line segments L31 and L32 extend from the vertex V3, line segments L41 and L42 extend from the vertex V4, line segments L51 and L52 extend from the vertex V5, and line segments L61 and L62 extend from the vertex V6.

Figure 5:
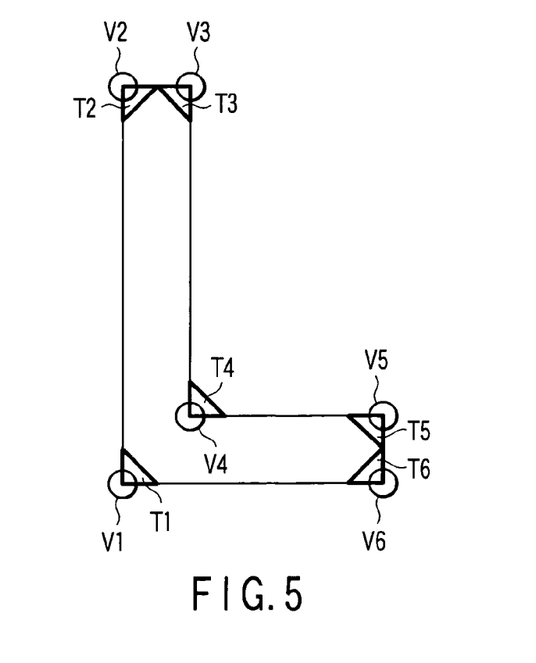
FIG. 5 is a diagram illustrating a step subsequent to that shown in FIG. 4.

Thereafter, as shown in FIGS. 5 and 7, the ends of each set of line segments are connected, thereby forming triangle process pattern elements (patterns for correction) T1 to T6 (a step S33).

Figure 6:
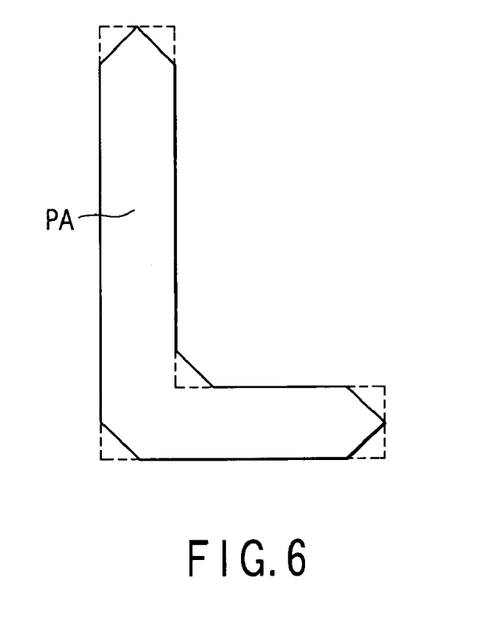
FIG. 6 is a diagram illustrating a step subsequent to that shown in FIG. 5.
Figure 7:
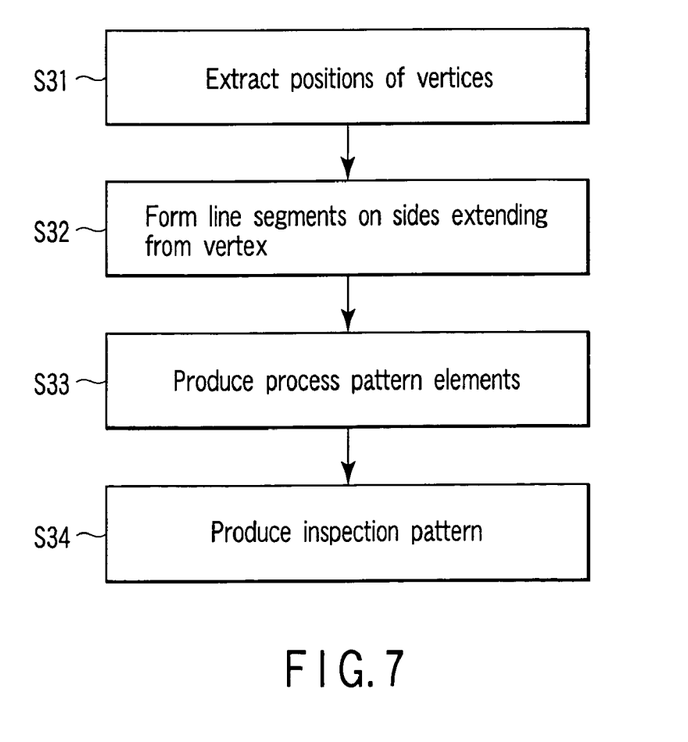
FIG. 7 is a flowchart illustrating a method for correcting a pattern at a corner.

Thereafter, as shown in FIGS. 6 and 7, the process pattern elements T1 to T6 are added to the original pattern P (a OR process) or deleted therefrom (a NOT process). As a result, an inspection pattern PA is produced (a step S34). The addition or deletion process is selected by comparing the pattern of the photomask 4 to be produced and the pattern of the mask data 2, so that the inspection pattern PA approximates to the shape of the pattern of the photomask 4 to be produced. More specifically, the process pattern elements T2, T3, T5 and T6 at the ends of the pattern P are deleted from the pattern P. The process pattern element T4, which is at the corner and outside the pattern P, is added to the pattern P. The process pattern element T1, which is at the corner and on the pattern P (the interior of the pattern P), is deleted from the pattern P.

Figure 8:
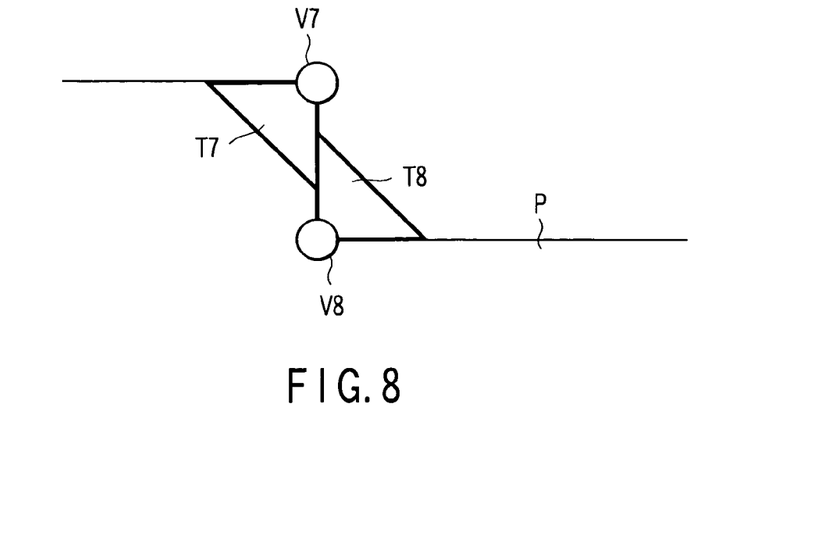
FIG. 8 is a diagram illustrating a modification of the method for correcting a pattern at a corner.
Figure 9:
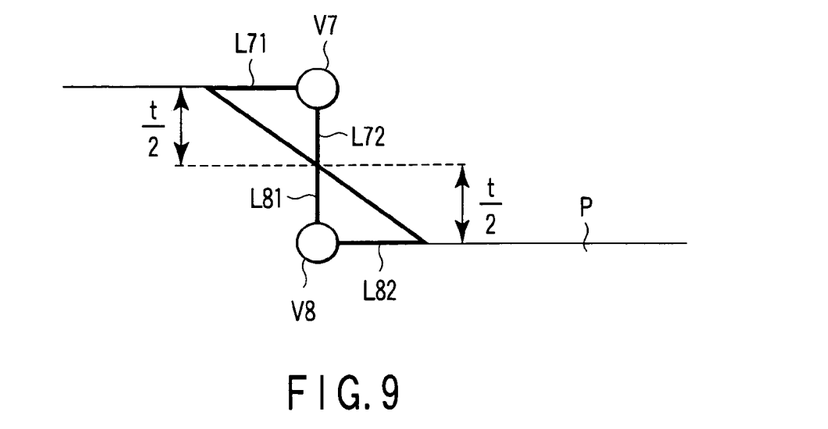
FIG. 9 is a diagram illustrating a step subsequent to that shown in FIG. 8.
Figure 10:
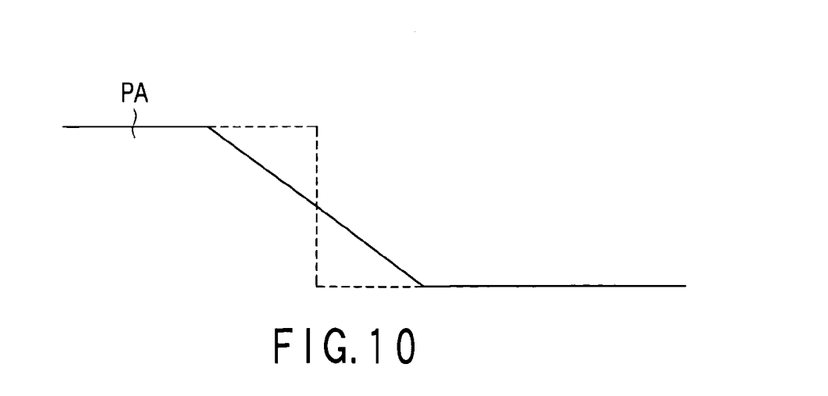
FIG. 10 is a diagram illustrating a step subsequent to that shown in FIG. 9.

A modification of the correction of the corner of the pattern P will now be described with reference to FIGS. 8 to 11. FIGS. 8 to 10 schematically show only a corner of a pattern.

As a result of the extraction of vertices V7 and V8 in the step S31 in FIG. 7, as shown in FIG. 8, the distance between the vertices V7 and V8 may be shorter than t×2, depending on the shape of the pattern P. In this case, as shown in FIG. 9, line segments L71, L72, L81 and L82, of the length of, for example, t/2, are formed. Correction pattern elements T7 and T8 are formed of these line segments. The subsequent steps are the same as those shown in FIG. 7. As a result of the process described above, the corner shape of the inspection pattern PA is corrected to the shape shown in FIG. 10.

Figure 11:
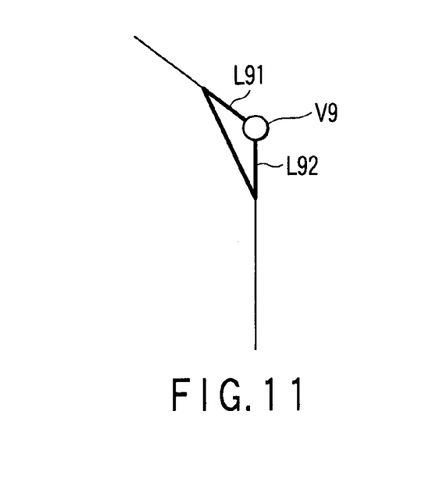
FIG. 11 is a diagram illustrating a modification of the method for correcting a pattern at a corner.

The corner of the pattern P is generally right-angled. However, it may be nonright-angled as shown in FIG. 11. The subject of the process may be extended such that correction of a nonright-angled corner may be carried out in the same manner as in the case of the right-angled corner.

Figure 12:
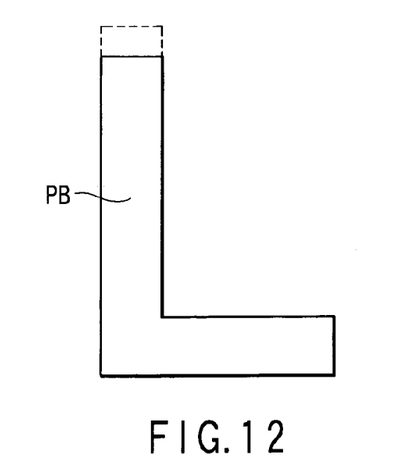
FIG. 12 is a diagram illustrating a step of a method for correcting a pattern at a line portion end.
Figure 13:
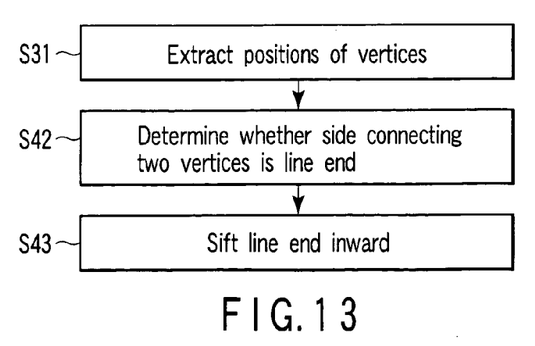
FIG. 13 is a flowchart illustrating a method for correcting a pattern at a line portion end.

Correction with respect to a line portion end of a pattern will be described with reference to FIGS. 12 and 13. FIG. 12 schematically shows a produced inspection pattern. FIG. 13 is a flowchart illustrating a process for correcting the pattern end portion.

First, as shown in FIGS. 3 and 13, positions of vertices V1 to V6 of a pattern P are extracted (the step S31). Then, it is determined whether a line connecting adjacent two of the vertices V1 to V6 is an end of the pattern or not (a step S42). This determination is performed as follows, for example. Assume that the coordinates of the vertices V1 to V6 are traced sequentially from the vertex V1. In this case, the trajectory line turns 90 degrees at the vertex V2, and further 90 degrees at the vertex V3. If the distance between the two vertices, where the turn successively occurs twice, is a predetermined value or less, the side defined by the two vertices (in this case, V2 and V3) is determined to be a line width.

Then, the line portion end is shifted inward (a step S43). As a result, the inspection pattern PB is produced. Correction values are selected by comparing the pattern of the photomask 4 to be produced and the pattern of the mask data 2, so that the inspection pattern PB approximates to the shape of the pattern of the photomask 4 to be produced.

Figure 14:
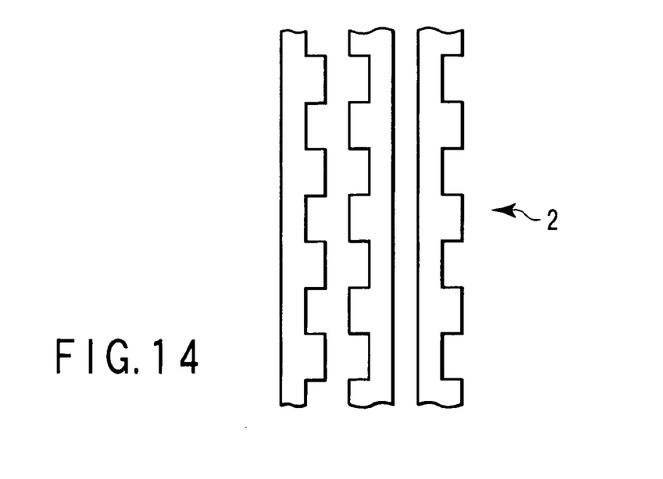
FIG. 14 is a diagram illustrating part of mask data.
Figure 15:
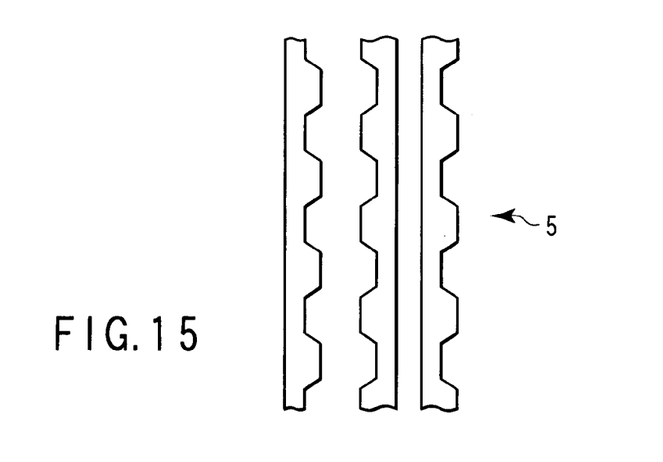
FIG. 15 is a diagram illustrating part of inspection data.
Figure 16:
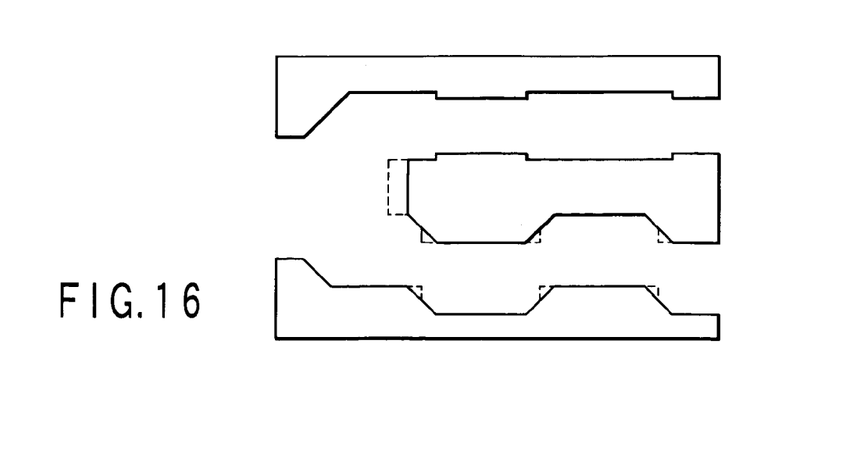
FIG. 16 is a diagram illustrating part of inspection data.

The process described above with reference to FIGS. 3 to 13 is performed with respect to the corners and line portion ends of the mask data 2 in the step S11 shown in FIG. 1. As a result, the inspection data 5 shown as an example in FIG. 15 is produced from the mask data 2 shown as an example in FIG. 14. FIG. 16 shows an example of the inspection data 5 for a pattern of the gate of a DRAM. In FIG. 16, the portion indicated by the broken line is a portion processed by the inspection data correction.

In the method for inspecting a defect of a photomask according to the first embodiment of the present invention, the inspection data 5 having a pattern shape, that is approximate to the pattern shape of the photomask 4 to be produced from the mask data 2, is obtained by correcting the mask data 2. In other words, the mask data 2 is subjected to correction at a pattern corner, line portion ends or the like, which cannot be dealt with by the correction of a process conversion difference, so that the inspection data 5 is produced. Then, the inspection data 5 is compared with the produced photomask 4, thereby extracting a defect portion of the photomask 4. Therefore, a pseudo-defect does not occur in a portion that cannot be dealt with by the correction of the process conversion difference when they are compared for an inspection. In the conventional method, many pseudo-defects occur, and a step for distinguishing a real defect from them is required. However, in the present invention, such a step is unnecessary. Consequently, according to the first embodiment of the present invention, the time for detecting a defect is considerably reduced.

As described above, correction of a process conversion difference may be performed in the stage where the mask data 2 is produced from the design data 1. In this case, the pattern of the mask data 2 should match the pattern of the produced photomask 4. Therefore, if the mask data 2 is used as the inspection data 5, ideally no pseudo-defect will occur. Actually, however, the pattern of the photomask 4 differs from the pattern of the mask data 2 in processes (lithography, etching, etc.) for producing the photomask 4. As a result, a pseudo-defect occurs. Therefore, the first embodiment is also effective to prevent such a pseudo-defect.

Second Embodiment

A second embodiment relates to an auxiliary pattern, which a photomask has but is not developed on a wafer.

A minute auxiliary pattern, called an SRAF (Sub-resolution Assist Feature), is known as a pattern that is not developed on a wafer. The auxiliary pattern is inserted in the photomask 4 in order to improve the resolution of a minute pattern in a lithography step. The auxiliary pattern is formed in the vicinity of a pattern necessary for a device (called a main pattern or a first pattern).

The auxiliary pattern (second pattern) is unnecessary to an actual device. Therefore, it is thinner than the main pattern such that it may not be formed on a wafer. Since the auxiliary pattern is thus fine, there is a great difference in shape between the SRAF pattern on the inspection data 5 and the auxiliary pattern in the photomask 4. For this reason, a pseudo-defect may occur at a line portion end or a corner of the auxiliary pattern in the inspection of a defect using the inspection data 5. To avoid this, the inspection data 5 is produced so that the shapes of the line portion ends and corners of the auxiliary pattern match those of the photomask 4 to be produced. More specifically, the patterns for forming the auxiliary pattern in the photomask 4 (the addition pattern) of the mask data 2 are subjected to correction of the inspection data in the same manner as in the first embodiment.

As described above, the auxiliary pattern is arranged in the vicinity of the main pattern. The "vicinity" means a position that satisfies the following condition:

$$0.8 \leq SS \leq 2 \times W \tag{1}$$

where W represents a minimum width of the main pattern, and SS represents a distance between the main pattern and the auxiliary pattern.

The auxiliary pattern, as described above, is smaller than the main pattern, and more specifically, satisfies the following condition:

$$0.05 \leq SW/(\lambda/NA) \leq 0.3 \tag{2}$$

where SW represents a size (width) of the auxiliary pattern, $\lambda$ represents an exposure wavelength of an exposure apparatus for producing the photomask, and NA represents a lens aperture of the exposure apparatus.

According to the method for inspecting a defect in a photomask, the same effect as in the first embodiment is obtained in a photomask 4 having an auxiliary pattern.

In the inspection by comparison between the photomask 4 and the inspection data 5, the sensitivity of an inspection in a specific portion (a corner or line portion end) of the main pattern or the auxiliary pattern may be intentionally reduced. The reduction in sensitivity is achieved by adjusting, by hardware or software, for example, the image gradation, the image resolution or the number of pixels in inspecting the photomask by the photomask inspection apparatus. In recent years, an apparatus is known, which can adjust the sensitivity of an inspection in accordance with the shapes of the respective patterns (line portion ends, corners, an auxiliary pattern portion, etc.). In the inspection method using such an apparatus, a pseudo-error is prevented from occurring in a step of inspecting a mask defect resulting from the difference between the photomask 4 and the inspection data 5. This method may be combined with the first or second embodiment of the present invention. In this case, the effect of suppressing a pseudo-error can be further improved.

A semiconductor device is produced with the use of the photomask 4, which is determined to be a conforming item through the inspection according to the method of the first or second embodiment. In other words, in the process of manufacturing a semiconductor device, the photomask 4 is interposed between a film to be processed (e.g., photoresist) formed on a semiconductor substrate and an exposure light source. Then, the film to be processed is exposed to light via the photomask 4, with the result that the pattern is transferred to the film to be processed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for inspecting a defect in a photomask which is produced by using graphic data, that match mask data or are produced by subjecting mask data to correction of a process conversion difference relating to at least a line portion width, the method comprising:
    producing inspection data by correcting a pattern of mask data so as to substantially match a planar shape of a pattern of a photomask to be produced by using the graphic data;
    comparing a pattern of a produced photomask with a pattern of the inspection data;
    extracting portions where planar shapes of the pattern of the inspection data and the pattern of the produced photomask do not match; and
    distinguishing a defect from the portions where the planer shapes do not match.

2. The method according to claim 1, wherein producing inspection data includes deleting an end region from a line portion of the pattern of the mask data by a small area.

3. The method according to claim 1, wherein producing inspection data includes deleting a pattern for correction from a corner of the pattern of the mask data or adding a pattern for correction to a corner of the pattern of the mask data.

4. The method according to claim 1, wherein the photomask is produced by a photomask graphic apparatus using an electron beam or an excimer laser beam.

5. The method according to claim 4, wherein the excimer laser beam is one of a KrF beam, an ARF beam or an $F_2$ beam.

6. The method according to claim 1, wherein comparing a pattern of a produced photomask is carried out in a state where inspection sensitivity for comparing the produced photomask with the inspection data is reduced in a photomask defect inspecting apparatus.

7. The method according to claim 6, wherein the inspection sensitivity for comparing is reduced with respect to a line portion end or a corner of the pattern of the photomask.

8. The method according to claim 1, wherein the photomask includes a first pattern and a second pattern, the second pattern being located near the first pattern with a first distance therebetween and satisfying the following condition:

$$0.05 \leq W2/(\lambda/NA) \leq 0.3$$

where W2 represents a width of the second pattern, $\lambda$ represents an exposure wavelength of an exposure apparatus which exposes the first pattern and the second pattern to a wafer, and NA represents a lens aperture of the exposure apparatus.

9. The method according to claim 8, wherein the first distance satisfies the following condition:

$$0.8 \times W1 \leq \text{the first distance} \leq 2 \times W1$$

where W1 represents a minimum width of the first pattern.

10. The method according to claim 8, wherein
    the mask data includes an additional pattern to form the second pattern in a photomask to be produced, and
    producing inspection data includes deleting an end region from a line portion of the additional pattern by a small area.

11. The method according to claim 8, wherein
    the mask data includes an additional pattern to form the second pattern in a photomask to be processed, and
    producing inspection data includes deleting a pattern for correction from a corner of the additional pattern or adding a pattern for correction to a corner of the additional pattern.

12. The method according to claim 9, wherein comparing a pattern of a produced photomask is carried out in a state where inspection sensitivity for comparing the produced photomask with the inspection data is reduced in a photomask defect inspecting apparatus.

13. The method according to claim 12, wherein the inspection sensitivity for comparing is reduced with respect to the second pattern.

14. A method for manufacturing a semiconductor device, comprising:
    exposing a film to be processed formed on a semiconductor substrate during manufacture of a semiconductor device by means of a photomask, which is determined as having no defect by the method for inspecting a defect in a photomask according to claim 1.

15. A method for manufacturing a photomask by using graphic data, that match mask data or are produced by subjecting mask data to correction of a process conversion difference relating to at least a line portion width, the method comprising:
    producing inspection data by correcting a pattern of mask data so as to substantially match a planar shape of a pattern of a photomask to be produced by using the graphic data;
    comparing a pattern of a produced photomask with a pattern of the inspection data;
    extracting portions where planar shapes of the pattern of the inspection data and the pattern of the produced photomask do not match;
    distinguishing a defect from the portions where the planer shapes do not match; and
    selecting the photomask which is determined as having no defect.

* * * * *